(12) United States Patent
Campardo et al.

(10) Patent No.: US 6,456,527 B1
(45) Date of Patent: Sep. 24, 2002

(54) NONVOLATILE MULTILEVEL MEMORY AND READING METHOD THEREOF

(75) Inventors: Giovanni Campardo, Bergamo; Rino Micheloni, Turate, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/501,131

(22) Filed: Feb. 9, 2000

(51) Int. Cl.[7] .............................................. G11C 16/00
(52) U.S. Cl. ............................ 365/185.03; 365/185.13; 365/185.19
(58) Field of Search ...................... 365/185.03, 185.13, 365/185.12, 185.19

(56) References Cited

U.S. PATENT DOCUMENTS

| | | | |
|---|---|---|---|
| 5,508,958 A | 4/1996 | Fazio et al. | 365/185.19 |
| 5,694,356 A | 12/1997 | Wong et al. | 365/185.03 |
| 5,717,636 A * | 2/1998 | Dallabora et al. | 365/185.13 |

* cited by examiner

*Primary Examiner*—Vu A. Le
(74) *Attorney, Agent, or Firm*—Lisa K. Jorgenson; Robert Iannucci; Seed IP Law Group PLLC

(57) ABSTRACT

A multilevel memory stores words formed by a plurality of binary subwords in a plurality of cells, each cell having has a respective threshold value. The cells are arranged on cell rows and columns, are grouped into sectors divided into sector blocks, and are selected via a global row decoder, a global column decoder, and a plurality of local row decoders, which simultaneously supply a ramp voltage to a biasing terminal of the selected cells. Threshold reading comparators are connected to the selected cells, and generate threshold attainment signals when the ramp voltage reaches the threshold value of the selected cells; switches, are arranged between the global word lines and local word lines, opening of the switches is individually controlled by the threshold attainment signals, thereby the local word lines are maintained at a the threshold voltage of the respective selected cell, after opening of the switches.

20 Claims, 4 Drawing Sheets

NONVOLATILE MULTILEVEL MEMORY AND READING METHOD THEREOF

TECHNICAL FIELD

The present invention relates to a nonvolatile multilevel memory and a reading method therefor, in particular for flash memories.

BACKGROUND OF THE INVENTION

As known, the need for nonvolatile memories with an always increasing density, is leading to design of multilevel memories, wherein data, stored in the floating gate regions of the cells, is coded on several logic levels, by dividing the quantity of charge stored in each cell.

FIG. 1 shows the characteristic linking the gate-source voltage $V_{gs}$ with the drain-source current $I_{ds}$ of a flash cell, biased in known manner with reading voltages, for a two-level memory, i.e., a memory wherein data is coded in each memory cell by a bit having two possible values, associated respectively with an off and an on condition of the cell, in turn dependent on whether the cell has been programmed. In particular, in FIG. 1, $V_{tv}$ and $V_{tw}$ represent the value of the gate-source voltage $V_{gs}$ at which a flash cell begins to conduct current, respectively for a virgin (erased) cell, and a written cell. In a memory of this type, the logic value "1" is generally associated to the characteristic having the threshold voltage $V_{tv}$, generally comprised between 0.5 and 2.5 V, and the logic value "0" is generally associated to the characteristic having the threshold voltage $V_{tw}$, and is generally greater than 5 V.

It is also known that reading a memory cell is based on converting the current flowing in the memory cell, at a specific gate-source voltage $V_{gs}$, into a voltage then translated to a CMOS level, at the output of a comparator circuit. An example of a known reading circuit is shown in FIG. 2; the reading circuit 1 comprises a current/voltage converter (comprising a current mirror circuit 2), and a comparator 3; the current mirror circuit 2 has two nodes, connected respectively to a memory cell 4 and to a reference cell 5, as well as to the inputs of the comparator 3, the output whereof supplies the signal at CMOS level, thus coding the read bit.

For multilevel cells, the plane ($V_{gs}$, $I_{ds}$) is divided by several characteristics, as shown for example in FIG. 3, concerning the storage of two bits per cell, corresponding to four logic values 11, 10, 01 and 00. In this case, the four logic values correspond to four different threshold values Vt1, Vt2, Vt3 and Vt4, which in turn are associated with different quantities of charges stored in the floating gate region of the memory cells.

Programming of the cells is affected by uncertainty, and the characteristics both of FIG. 1 and FIG. 3 represent the central value of the actually obtainable distributions; in fact, to each threshold value a respective distribution of values is associated, comprised between a minimum value and a maximum value, and spaced from the maximum values of the preceding distribution, and/or from the minimum value of the successive distribution, to allow correct reading of the cells. In addition, each distribution can have a different amplitude, as shown for example in FIG. 4, showing the distributions associated with memory cells storing each two bits, using a not uniform scale.

Also here, reading comprises converting the current flowing in the cell, into a voltage; the voltage thus obtained is then compared with different intermediate voltage values within the above-described threshold distributions.

One of the problems arising when reading multilevel cells, is caused by the reading voltage applied to the gate terminals of the cells to be read; in fact, at the reading voltage, all the read cells (optionally except the cells programmed to the highest threshold value) must be on, to compare the converted voltage with the various voltage levels; consequently, the reading voltage must be at least greater than the last but one threshold value ($V_{t3}$ in FIG. 2; $V_R$ in FIG. 4, here of 6V).

FIG. 5 shows the characteristics variability intervals taking into account the distributions of the threshold voltages shown in FIG. 4, as well as three reference current values, $I_{R1}$, $I_{R2}$, $I_{R3}$, (indirectly) compared with the current flowing in the memory cells, at the reading voltage $V_R$. In practice, the three reference current values are intermediate between the different distributions of characteristics.

FIG. 6 shows an example of a reading logic circuit 10, supplying at the output two bits 01, 02 stored in a cell, after comparison with three reference voltages $V_1$, $V_2$, $V_3$, corresponding to the reference current values $I_{R1}$, $I_{R2}$, $I_{R3}$ of FIG. 5.

In detail, the reading logic circuit 10 comprises three comparators 11, 12, 13, receiving at their non-inverting inputs a voltage $V_m$, obtained from the conversion of the current flowing in a read memory cell and receiving at their inverting input a respective reference voltage $V_1$, $V_2$, $V_3$. The output of the comparator 11 is connected to a first input of a first, three-input AND gate 14; the output of the comparator 12 defines a first output 15 of the reading logic circuit 10, and is connected to a second input of the first AND gate 14, via a first inverter 16; the output of the comparator 13 is connected to a third input of the first AND gate 14, and to an input of a second, two-input AND gate 17. The output of the first AND gate 14 is connected to a second input of the second AND gate 17, via a second inverter 18. Thereby, the output 15 of the reading logic circuit 10 supplies the first bit 01; the output of the second AND gate 17 defines a second output 19 of the reading logic circuit 10, and supplies the second bit 02.

The memory cells of the considered type have small gain (20μA/V); in addition, the present architectures require that the reading voltage $V_R$ (at least equal to the lower limit of the threshold voltage distribution that is furthest to the right in FIG. 5, as previously explained), should not be too high. These conditions are a problem when reading cells storing four levels (two bits); in fact, it is necessary to distinguish currents differing from one another by 10 μA, but have different common mode contributions, since the difference between the different currents is always 10 μA, but the absolute value varies between 0 and 70 μA. The distinction is also made more complex by the gain variations associated with the various threshold voltages.

In known circuits, used for reading cells storing one or two bits, the current/voltage converter connected to the cell, and the comparators connected with the converter, are optimized on the basis of the present current and voltages. However, this solution is difficult to implement for cells storing more than four levels, in particular when a cell access time (overall reading time) is to be ensured of approximately 100–200 ns, as in the present circuits.

FIG. 7 refers to the storage of three bits per cell, corresponding to eight different threshold voltages (eight different binary words), and shows the threshold voltage variability intervals for the various binary words, ignoring the spacing necessary to avoid reading uncertainties. FIG. 7 also shows a possible distribution of the characteristics for the binary word 101.

Instead of using a constant value reading voltage, reading may be effected here by increasing the voltage applied to the gate terminal of the cell to be read from the upper distribution limit of the lower threshold voltage (for example 2 V in FIG. 7), to the lower distribution limit of the higher threshold voltage (6 V in FIG. 7). The reading voltage $V_R$ can be increased according to a continuous or discrete ramp; in the latter case (FIG. 8), the number of steps of the voltage ramp can be equivalent to the number of programmable threshold voltage levels, less one (seven, in this case).

In particular, the memory cell can be read using a reading circuit 23 shown in FIG. 9; in detail, the reading circuit 23 comprises a voltage/current converter 24, comprising two diode-connected PMOS transistors 25, 26, arranged between supply line 28, set to $V_{CC}$, and, respectively, a constant current source 29 (supplying current I, for example 10 μA), and the drain terminal of a cell 30 to be read. The cell 30 to be read has a source terminal connected to ground, and a gate terminal connected to the output of a ramp voltage generator, here formed by a digital/analog converter (DAC) 31; the input of DAC 31 receives a binary signal, specifying the value of the voltage $V_R$ to be generated as output, and is also connected to an input of a latch circuit 32. Latch circuit 32 has an enable input EN connected to the output of a comparator 33; the comparator 33 has a non-inverting input connected to the gate terminal of the transistor 25, and an inverting input connected to the gate terminal of the transistor 26.

Thereby, when the current flowing in the cell 30 exceeds the current I generated by the constant current source 29, the comparator 33 switches, by blocking, in the latch 32, the binary value of the ramp voltage $V_R$ applied then to the cell 30 to be read, and subsequently supplied as output.

By defining as the threshold of the cell 30 to be read the gate-source voltage $V_{gs}$ at which the cell 30 absorbs a current value I, the comparator 33 checks whether the threshold of the cell 30 is in the area of the plane in FIG. 8 corresponding to row voltage $V_R$ applied at that moment. This operation requires one reading circuit 23 (sense amplifier) per cell, i.e., every three bits, instead of one reading circuit for every bit, as in the two-level memories of known type, thus saving a considerable amount of area.

If the cell stores binary word 101, as in the example considered in FIG. 7, the comparator 33 switches to the third level of row voltage $V_R$ (of 3.3 V in the example).

The row voltage steps, which are seven in number, can have a duration of 15 ns, ns, taking the output time of row voltage $V_R$ to 105 ns, compared with the 30 ns at present. This delay is compensated by the fact that three bits, instead of one, are simultaneously read.

The solution shown in FIG. 9 functions for up to three bits per cell, i.e., eight levels, but it cannot be applied to a greater number of levels, since the access time would become too long. In addition, the duration for each voltage step cannot be reduced below a given value, to ensure efficient reading of the cells.

FIG. 10 shows a known architecture of a nonvolatile memory 40, comprising a global row decoder 41; a column decoder 42, and a memory array 43, comprising a plurality of sectors (of which only two, indicated as 44a and 44b, are shown in the figure). The global row decoder 41 is connected to a plurality of global word lines 46, and the column decoder 42 is connected to a plurality of bit lines 47. Each global word line 46 is associated, for each sector 44a, 44b, to a pair of local word lines 48a, 48b, selected individually and alternately, according to address signals supplied from the exterior, via a local row decoder 45a, 45b associated with the respective sector 44a, 44b.

With an architecture of this type, each binary word (byte) is stored in cells arranged on a same row within a single sector, but on different columns, as shown schematically in FIG. 10 by bit lines 47 relative to bits 0 and 7 of the words stored in sectors 44a and 44b. Thereby, a byte is read by switching on the cells arranged on a row and by converting individually into voltage the current flowing through these cells, present on the respective bit lines 47.

SUMMARY OF THE INVENTION

An object of the invention is thus to provide a memory and a reading method which eliminate the disadvantages of the known methods and devices, thus allowing reading of multi-level cells quickly and reliably.

The multilevel memory stores words formed by a plurality of binary subwords in a plurality of cells, each cell having has a respective threshold value. The cells are arranged on cell rows and columns, are grouped into sectors divided into sector blocks, and are selected via a global row decoder, a global column decoder, and a plurality of local row decoders, which simultaneously supply a ramp voltage to a biasing terminal of the selected cells. Threshold reading comparators are connected to the selected cells, and generate threshold attainment signals when the ramp voltage reaches the threshold value of the selected cells; switches, are arranged between the global word lines and local word lines, opening of the switches is individually controlled by the threshold attainment signals, thereby the local word lines are maintained at a the threshold voltage of the respective selected cell, after opening of the switches.

BRIEF DESCRIPTION OF THE DRAWINGS

To help understanding of the present invention, a preferred embodiment is now described, purely by way of non-limiting example, with reference to the attached drawings, wherein.

DETAILED DESCRIPTION OF THE DRAWINGS

Figure 11:
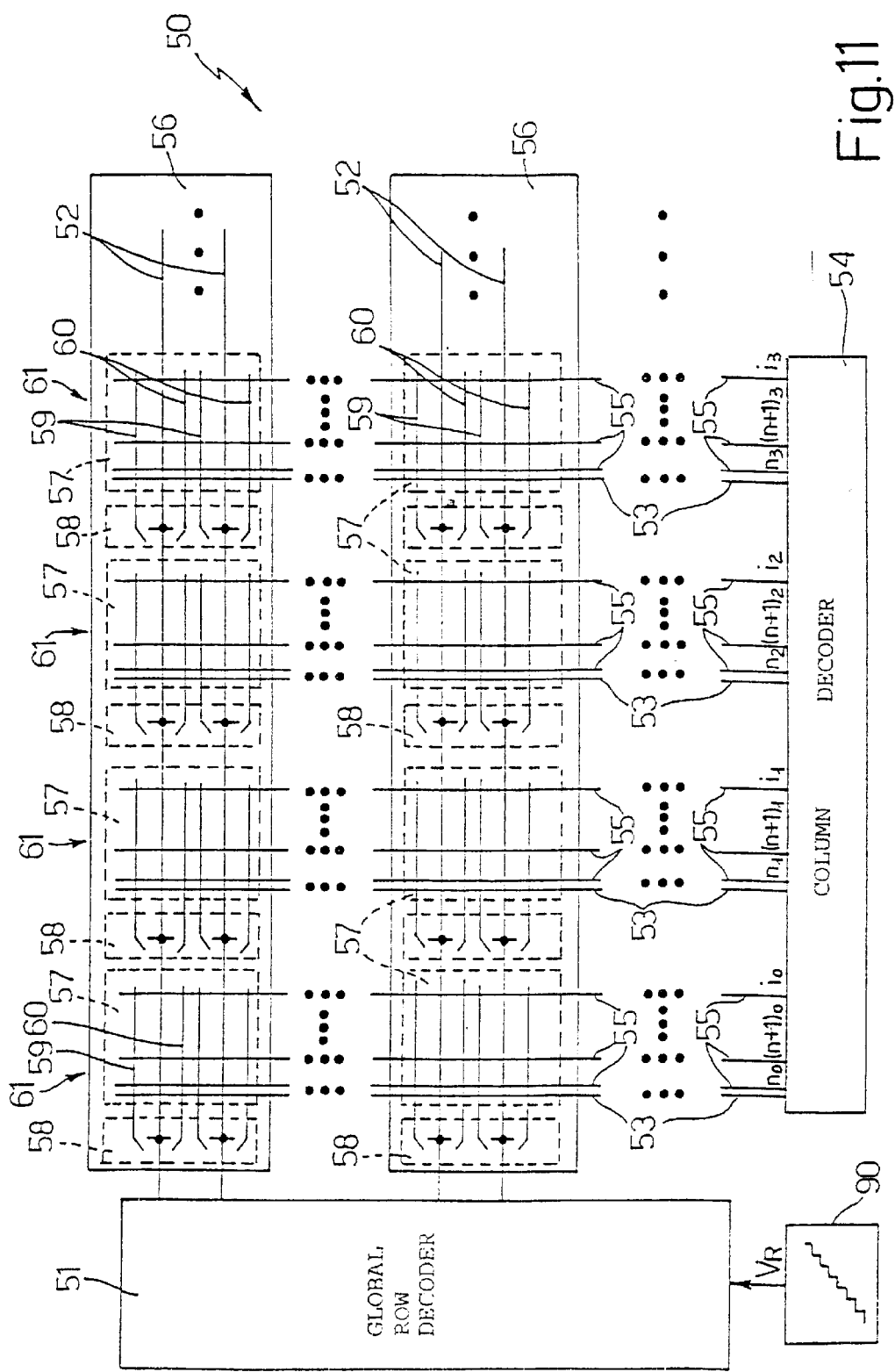
FIG. 11 shows the architecture of a memory according to an embodiment of the invention.

FIG. 11 shows the architecture of a memory 50, of a nonvolatile type, according to an embodiment of the invention. In the following description, the term "subword" is used to indicate the set of bits stored in an individual cell (three bits for an eight-level memory, and four bits for a sixteen-level memory). Consequently, when storing 4 bits per cell, a 64-bit word is divided into 16 subwords, and is stored in 16 cells. However, the invention is not limited to a particular number of bits per cell.

In detail, the memory 50, shown only for the parts necessary for understanding of the invention, comprises a global row decoder 51, receiving a ramp supply voltage from a ramp generator 90, and supplying it to a selected one of a plurality of global word lines 52, typically made of metal, in a known manner; a column decoder 54, connected to a plurality of biasing lines 55, similar to conventional bit lines, for column addressing the memory cells, and a plurality of output lines 53, supplying the voltage read in the addressed cells, as described hereinafter; a plurality of sectors 56, arranged on rows; a plurality of blocks 57 in each sector 56; a plurality of local row decoders 58, one for each block 57, selectively connecting one of two local lines 59, 60, typically made of polycrystalline silicon, to the respective global line 52, according to address signals supplied by a logic unit (not shown) of the memory 50.

In detail, the blocks 57 of each sector represent only subassemblies of the respective sector, and thus the cells of all blocks 57 belonging to the same sector have their erase terminal (normally the source terminal) connected together. In addition, although here the local row decoders 58 are shown each adjacent to a respective block 57 within the respective sector 56, they can be disposed in the most appropriate position.

In the memory 50 of FIG. 11, the blocks 57 are superimposed in columns, such as to form columns of blocks 61, and all the local lines 59, 60 are connected to an equivalent number of cells. In particular, each block 57 of a given column 61 stores the subwords which have the same position in different words (subword 0 relative to the bits 0–3, subword 1 relative to the bits 4–7 etc), and the individual subwords belonging to a single word are stored in cells belonging to different blocks. In practice, in the shown example, the number of blocks 57 for each sector is equivalent to the number of subwords of each word; in addition, the subwords of a same word are stored in cells connected to aligned local word lines (i.e., to local word lines 59 connected to a same global word line 52, or to local word lines 60 connected to a same global word line 52).

This is represented symbolically by the reference $n_0$, $(n+1)_0, \ldots i_0; n_1, (n+1)_1, \ldots i_1, n_2, (n+1)_2, \ldots i_2$, associated with the biasing lines, in which n, (n+1) and i indicate that the concerned subword belongs to the n–, (n+1)– or i-th line, and the subscript number indicates the subword 0, 1, 2, . . . of the considered word. Thereby, the cells storing the various subwords of a same word are addressed by a same global word line 52, but different local word lines 59, 60, thus allowing to separately block the row voltage applied to the local word lines 59, 60 connected to a same global word line 52, when the row voltage becomes equal to the threshold stored in the single read cell, as described in greater detail hereinafter with reference to FIG. 12.

In each sector 56, the number of output lines 53 is equal to the number of blocks 57 in each sector 56; in practice, each output line 53 is connected, in the manner described in detail with reference to FIG. 12, to the blocks 57 arranged in columns, i.e., vertically aligned.

Figure 12:
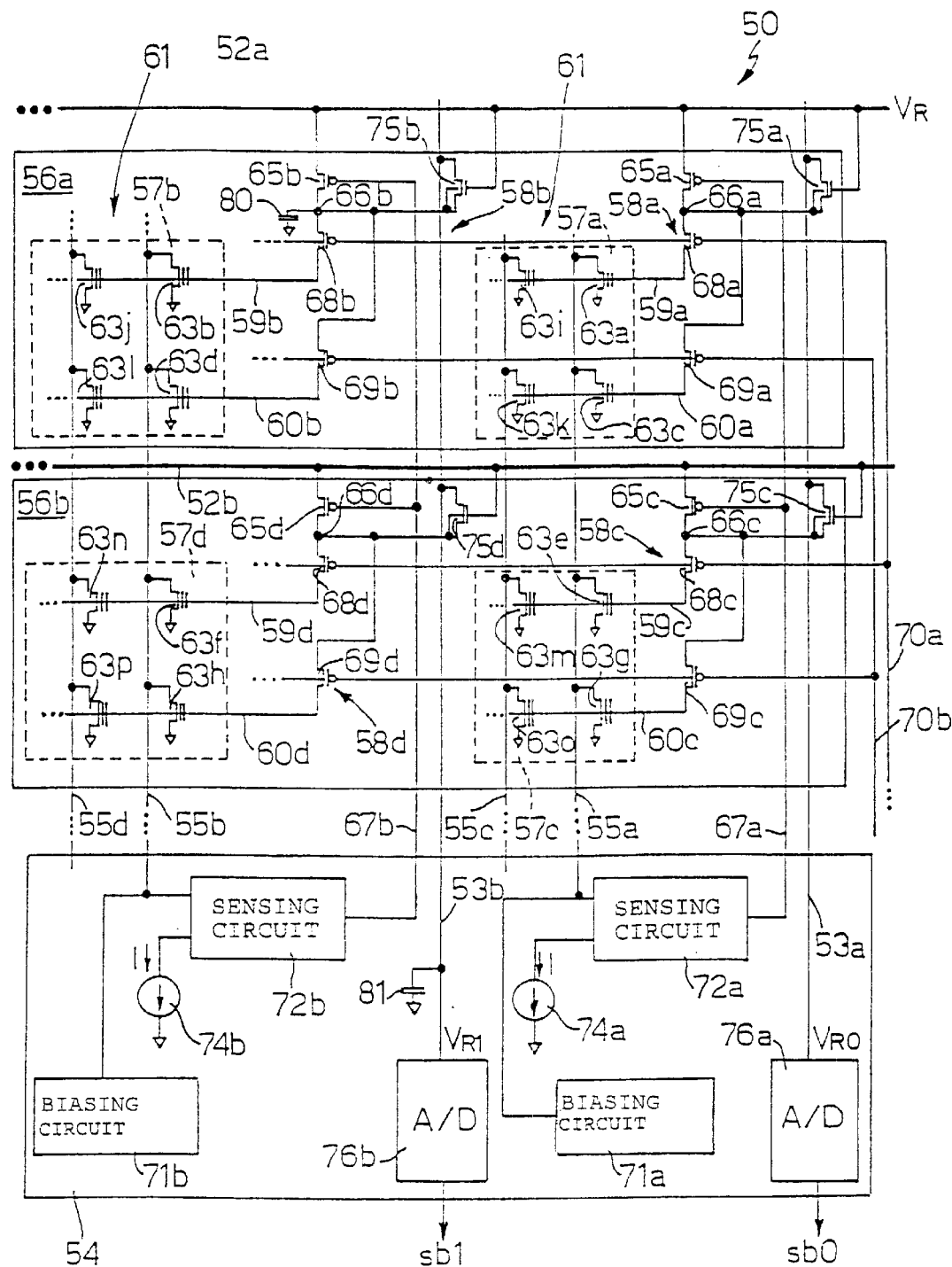
FIG. 12 shows the circuit structure of part of the memory of FIG. 11.

FIG. 12 shows part of the memory 50, relative to sixteen memory cells, indicated at 63a, 63b, . . . , 63p, used for storing subwords 0 and 1 of eight different words in two different sectors 56a, 56b, and thus arranged on four rows and four columns; in particular, the memory cells 63a, 63b relate to a first word in sector 56a, and are thus connected to a same global word line 52a, but they belong to different blocks 57a, 57b, and thus have gate terminal connected to different local word lines 59a, 59b; the memory cells 63c, 63d relate to a second word in sector 56a, and are thus connected to the same global word line 52a, but belong to different blocks 57a, 57b, and thus have gate terminal connected to different local word lines 60a, 60b the memory cells 63e, 63f relate to a third word in sector 56b, and are thus connected to the same global word line 52b, but belong to different blocks 57c, 57d, and thus have gate terminal connected to different local word lines 59c, 59d; the memory cells 63g, 63h relate to a fourth word in sector 56b, and are thus connected to a same global word line 52b, but belong to different blocks 57c, 57d, and thus have gate terminal connected to different local word lines 60c, 60d. Finally, the cells 63i–63p store subwords belonging to another four words, and are connected in a manner similar to that described for the cells 63a–63h.

In addition, the memory cells 63a–63p have drain terminals connected to respective biasing lines 55a–55d; in particular, the memory cells 63a, 63c, 63e, 63g (arranged on a same column) are connected to the biasing line 55a, the memory cells 63b, 63d, 63f and 63h are connected to the biasing line 55b, the memory cells 63i, 63k, 63m and 63o are connected to the biasing line 55c, and the memory cells 63j, 63i, 63n and 63p are connected to the biasing line 55d. The memory cells 63a–63d, 63i–63i, belonging to sector 56a, have source terminals connected together; the memory cells 63e–63h, 63m–63p, belonging to sector 56b, have source terminals connected together; in the reading configuration shown, all the source terminals are also shown connected to ground.

In FIG. 12, the local row decoders associated with blocks 57a–57d, are indicated at 58a–58d; of the local row decoders 58a–58d and the column decoder 54, only the elements necessary for understanding of the invention are shown. In particular, each local row decoder 58a–58d comprises a biasing transistor 65a–65d of PMOS type, which has source terminal connected to the respective global word line 52a, 52b, drain terminal forming a node 66a–66d, and gate terminal connected to a respective enable line 67a, 67b; specifically, the gate terminals of biasing transistors 65a and 65c belonging to the local row decoders 58a, 58c, associated with blocks 57a and 57c arranged in columns, are connected to the enable line 67a, and the gate terminals of the biasing transistors 65a and 65d belonging to the local row decoders 58b, 58d, associated with blocks 57b and 57d arranged in columns, are connected to the enable line 67b.

The nodes 66a–66d are connected to the local word lines 59a–59d, 60a–60d via respective local decoding transistors 68a–68d and 69a–69d of PMOS type, which have source terminals connected to respective nodes 66a–66d, drain terminals connected to respective local word lines 59a–59d, 60a–60d, and gate terminals connected to local decoding lines 70a, 70b. In particular, the local decoding transistors 68a–68d, relative to local word lines 59a–59d, are connected to the local decoding line 70a, and the local decoding transistors 69a–69d, relative to the local word lines 60a–60d, are connected to the local decoding line 70b.

Figure 9:
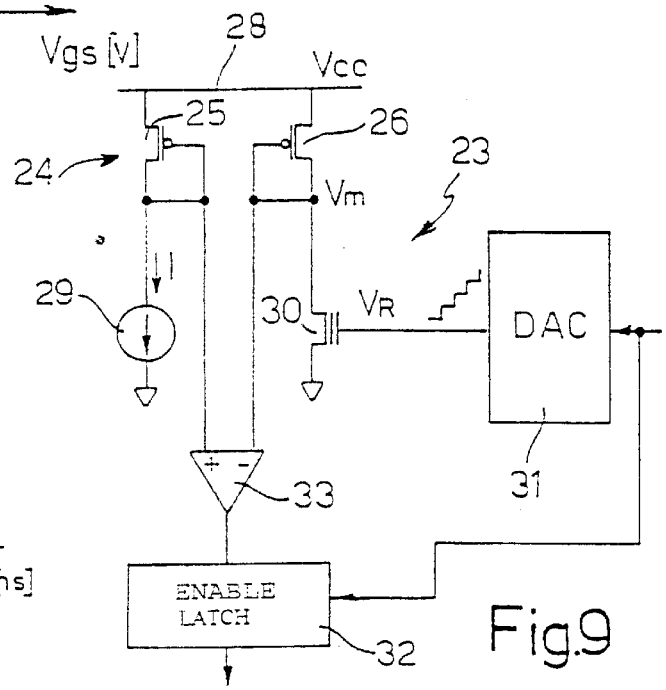
FIG. 9 shows a reading device usable for storing three bits per cell.
Figure 10:
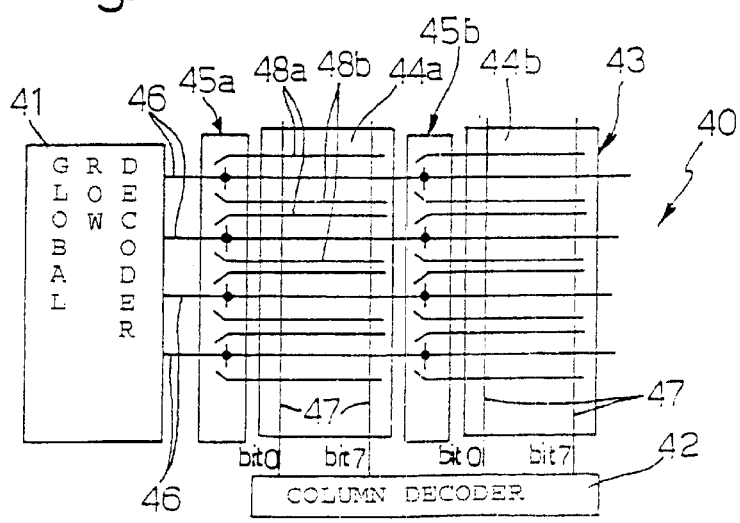
FIG. 10 shows a known architecture of a memory.

In the configuration shown, the biasing lines 55a, 55b are addressed, and are therefore connected, via selectors not shown and belonging to the column decoder 54, to respective biasing circuits 71a, 71b of known type, for biasing the biasing lines 55a, 55b to the required reading voltage (for example 1 V); in addition, they are connected to a first input of a respective sensing circuit 72a, 72b. The sensing circuits 72a, 72b comprise, in known manner, not illustrated, a current/voltage converter and a CMOS level transducer (for example of the type shown in FIG. 9), and have a second input connected to a respective current source 74a, 74b (generating a current I), and an output connected to a respective one of the enable lines 67a, 67b. On the other hand, the biasing lines 55c, 55d are not addressed, and are therefore floating, analogously to the standard bit lines.

The nodes 66a–66d are connected to output lines 53a, 53b, via selection transistors 75a–75d, of NMOS type. In detail, the selection transistor 75a associated with block 57a has a first terminal (drain) connected to node 66a, a second terminal (source) connected to the output line 53a, and a gate terminal connected to the global word line 52a; the selection transistor 75b, associated with the block 57b, has a first terminal connected to the node 66b, a second terminal connected to the output line 53b, and a gate terminal connected to the global word line 52a; the selection transistor 75c, associated with the block 57c, has a first terminal connected to the node 66c, a second terminal connected to the output line 53a, and a gate terminal connected to the global word line 52b; the selection transistor 75d, associated with block 57d, has a first terminal connected to node 66d, a second terminal connected to the output line 53b, and gate terminal connected to the global word line 52b. Therefore, the memory cells 63 belonging to vertically aligned blocks 57 are connected to a same output line 53a, 53b.

Figure 1:
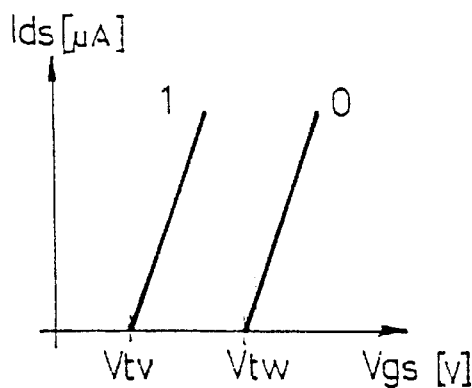
FIG. 1 shows the current-voltage characteristics used for storing one bit per cell of a memory.
Figure 3:
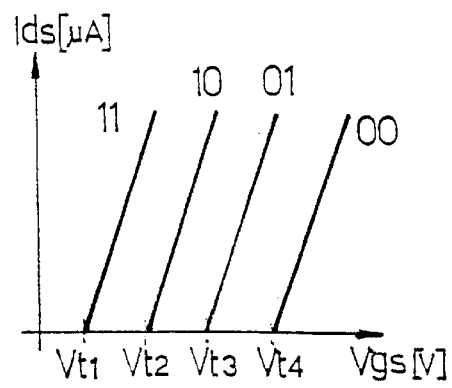
FIG. 3 shows the current-voltage characteristics used for storing two bits per cell of a memory.
Figure 4:
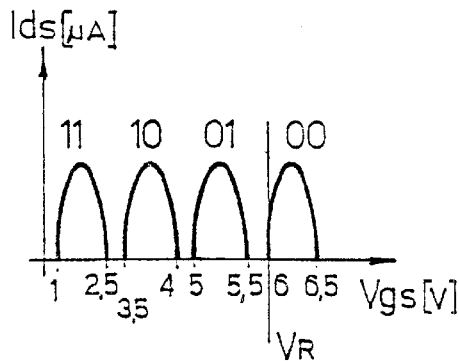
FIG. 4 shows the distribution of the effective threshold voltages, in case of storing two bits per cell.
Figure 5:
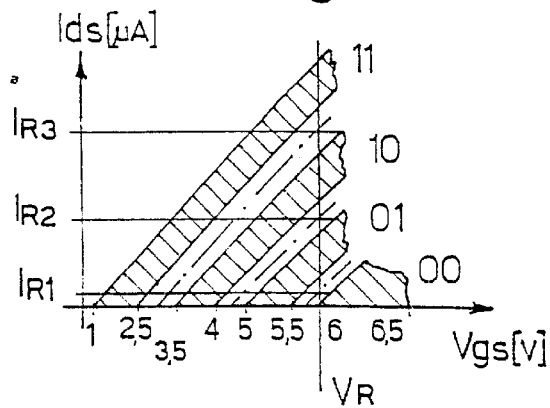
FIG. 5 shows the distribution of the characteristics when storing two bits per cell.
Figure 2:
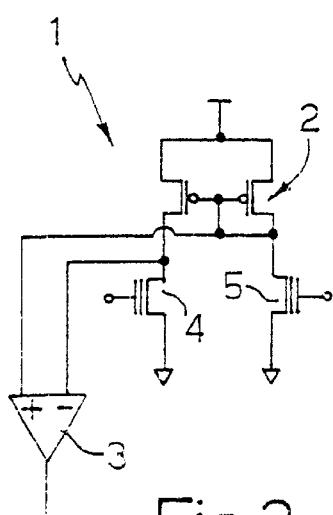
FIG. 2 shows a known reading device for one-bit cells.
Figure 6:
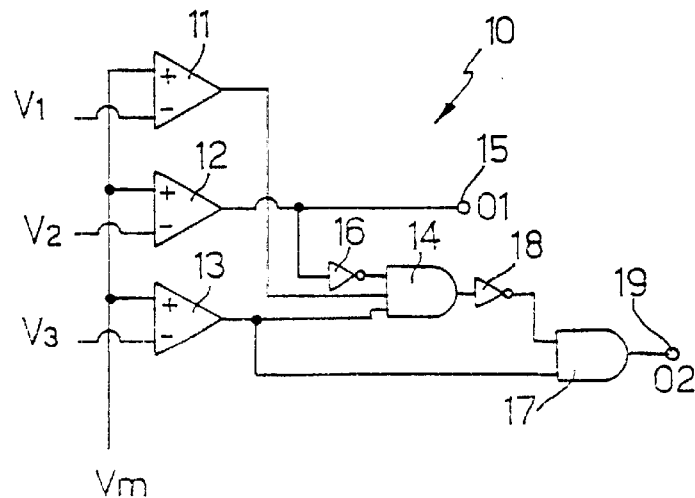
FIG. 6 shows a logic circuit belonging to the reading device, automatically supplying at the output the two bits stored in four-level cells.
Figure 7:
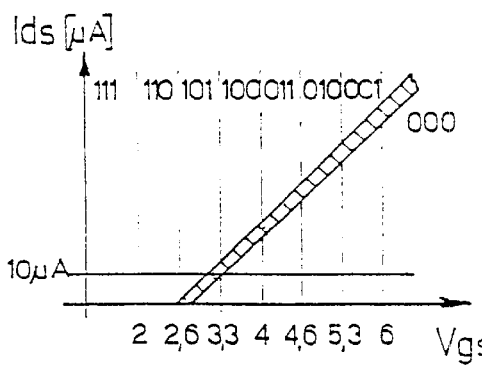
FIG. 7 shows a distribution of characteristics, and the sub-division of the current/voltage plane, when storing three bits per cell.
Figure 8:
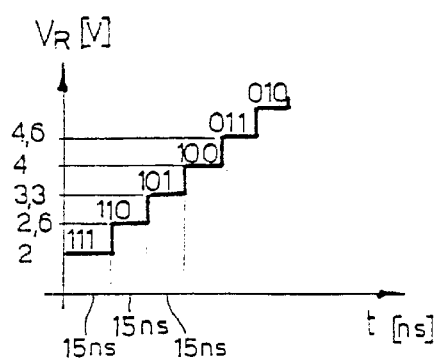
FIG. 8 shows the progression of the row voltage for reading three bits per cell.

The output lines 53a, 53b are connected to a respective A/D converter 76a, 76b, having for example the structure shown in FIG. 6, optionally adapted such as to supply at the output the number of bits associated with each subword (binary output subwords sb0, sb1).

The memory 50 of FIGS. 11 and 12 functions as follows. It is assumed that the word stored in the cells 63a, 63b, . . . must be read. In this situation, the global row decoder 51 selects the global line 52a associated with the cells to be read; simultaneously, the selectors associated with the biasing lines 55a–55d connect the biasing lines 55a, 55b, (relative to the cells to be read) to the biasing circuits 71a, 71b, . . . , and to the comparators 72a, 72b, . . . , and leave the biasing lines 55c, 55d floating, as shown. In addition, the local decoding line 70a is biased to a low voltage (ground), whereas the local decoding line 70b is biased to a high voltage ($V_R$) Consequently, the local decoding transistors 68a, 68b are switched on, and connect the local word lines 59a, 59b to the respective nodes 66a, 66b, and the local decoding transistors 68c, 68d are switched off; the local word lines 60a, 60b are kept grounded by elements, not shown, of the local decoders 58.

In addition, in this step, no current flows in the cells 63, and therefore the comparators 72a, 72b have a low output (ground), and the biasing transistors 65a, 65b are switched on and connect the respective nodes 66a, 66b to the respective global word lines 52a, 52b. Thereby, the only cells 63a, 63b to be read have a gate terminal connected to the addressed global word line 52a, and a drain terminal connected to the addressed biasing lines 55a, 55b, and they are therefore selected.

Consequently, as soon as the row voltage $V_R$ begins the discrete ramp increase step, only these cells 63a, 63b can be switched on, and begin to conduct current when the supplied row voltage $V_R$ has a value equal to the threshold value of the same cells. In addition, when the row voltage $V_R$ exceeds the threshold voltage of the selection transistors 75a, 75b, the latter are switched on, thus connecting the nodes 66a, 66b and the local word lines 59a, 59b associated with them, to the output lines 53a, 53b.

Specifically, by defining as the threshold value of a cell 63, the value of the gate-source voltage $V_{gs}$, at which the cell 63 absorbs the current I (similarly to the process described with reference to FIG. 9), if cell 63a has the lowest threshold value among the addressed cells 63a, 63b, . . . associated with the same word. As soon as the row voltage $V_R$ reaches the threshold value of the cell 63a, the comparator 72a, connected to the cell via the biasing line 55a, switches, taking its output to a high value ($V_R$). This causes only the biasing transistor 65a to switch off and only local word line 59a to disconnect from the global word line 52a. During the further increase of the row voltage $V_R$, the local word line 59a, owing to its capacitance (of approximately 0.5–1 pF), holds the threshold value of cell 63a (indicated at $V_{RO}$ in FIG. 12), and does not follow the progression of the row voltage $V_R$. On the other hand, the other local word lines 59b, . . . , connected to the global word line 52a, follow the plot of the row voltage $V_R$, until the latter reaches the threshold value $V_{R1}$, . . . , of the respective cell 63b, . . . , addressed. Thereby, at the end of the rising ramp of the row voltage $V_R$, each local word line 59a, 59b, . . . , is charged with the respective threshold value.

The stored threshold values are then decoded by the A/D converters 76a, 76b, . . . , and are available externally.

In practice, here, the functions of the bit lines of the standard memories have been divided: the biasing functions are now performed by the biasing lines 55a–55d, whereas the functions for transferring the read datum externally are performed by the output lines 53a, 53b, one for each subword. The biasing circuits 71a, 71b, . . . , the comparators 72a, 72b, . . . , and the current sources 74a, 74b, . . . , are similar to the standard sense amplifiers, with the difference that the output of the comparators 72a, 72b is not conveyed directly to the output, but is here used to separate the then addressed global word line from the local word line connected to the memory cell having a threshold value equal to, or lower than, the instantaneous value of the row voltage.

The selection transistors 75a, 75b, guarantee the necessary separation between the output lines 53a, 53b, and the nodes 66c, 66d associated with the not addressed global word lines.

The advantages of the described memory and the reading method are mainly due to the fact that they allow reading of multilevels cells, within times comparable with present ones, but with a considerable saving of space, since, in practice, the number of memory cells necessary to store the same quantity of data is reduced considerably.

Using the shown memory 50, for example, according to the number of levels to be stored in the memory cells, the row voltage $V_R$ can have a global increase time of 100–150 ns, which does not adversely affect the memory access time. Indeed, this value is to be compared with that of a standard parallel flash memory, operating at 3 V and having a time of 70 ns for accessing the individual bits. Here, reading a 16-level memory (4 bits per cell) provides 32 bits, when 8 cells are read simultaneously. To read 32 bits in a conventional memory, wherein 8 cells are parallel read, it is necessary to read 4 bytes in succession, with a total access time of 280 ns. Consequently, even taking into account the additional times necessary for reading the memory 50, the global reading time is comparable to, or even shorter than, that for a conventional memory.

FIG. 12 shows two parasitic capacitances associated with the shown circuit; in particular, a capacitor 80 is connected to node 66b, and represents the capacitance associated with the same node 66b (obviously, similar capacitances are associated with the other nodes 66a, . . . ), and a capacitor 81 is connected to the output line 53b, and represents the capacitance associated with the same output line 53b(also here, similar capacitances are associated with the other output lines 53a, . . . ). These capacitances, in conjunction with the threshold voltage of the selection transistors 75a–75d and the body effect, cause the voltage transferred to the A/D converters 76a, 76b, . . . , not to be exactly equal to the threshold voltages stored in the local word lines 59a, 59b, 60a, 60b. To reduce this problem, it is possible firstly to manufacture selection transistors 75a–75d having a low threshold and in a triple well; in addition, it is possible to add a constant term in the A/D converters 76a, 76b, . . . , or to use the same structure also for checking operations at the end of programming, since the absolute threshold value of the cells is not important, but is the relative distance between the various distributions.

Finally, it is apparent that many modifications and variants can be made to the memory and the method described and illustrated here, all of which come within the scope of the invention, as defined in the attached claims.

What is claimed is:

1. A nonvolatile multi-level memory for storing words formed from a plurality of subwords, comprising:

a plurality of cells, each cell having a respective threshold value coding a respective subword, said cells being disposed on cell rows and columns, and grouped into sectors;

cell selection means selectively addressing selected cells and simultaneously supplying a ramp voltage to a respective biasing terminal of each of said selected cells;

threshold reading means connected to said selected cells and generating threshold attainment signals when said ramp voltage reaches said threshold values of said selected cells; and switch means, arranged between said cell selection means and said biasing terminals of said selected cells, said switch means being individually controlled to open by said threshold attainment signals, thereby said biasing terminals are maintained at a voltage substantially equal to said threshold voltage, after opening of said switch means.

2. A memory according to claim 1 wherein each sector is divided into a plurality of blocks, each block containing a different subword of each word, and in that said cell selection means comprise means for selectively addressing a cell in each block of a sector.

3. A memory according to claim 2 wherein each sector includes a number of blocks, equal to the number of subwords in a word.

4. A memory according to claim 2 wherein said cell selection means comprise global word lines, extending parallel to said cell lines, and biasing rows, extending parallel to said cell columns, each biasing line being connected to first terminals of cells arranged on a same cell column and being connected to said threshold reading means, the memory further comprising local selection means that include local word lines, each local word line being connected to control terminals of cells of a single block; said switch means being arranged between said global word lines and said local word lines.

5. A memory according to claim 4 wherein said blocks of different sectors are vertically alinged in block columns, and said reading means comprise a comparator circuit for each block column, said comparator circuit having a first input, connected to a selected one of said biasing lines, connected to cells belonging to a respective block column, a second input, receiving a reference quantity, and an output connected to control terminals of said switch means of said respective block column.

6. A memory according to claim 5, further comprising an output line for each column of blocks, each said output line being connected to said local word lines via respective selection elements.

7. A memory according to claim 6 wherein said selection elements have control terminals connected to respective global word lines.

8. A memory according to claim 6 where in said selection elements comprise MOS transistors.

9. A memory according to claim 4 wherein said switch means comprise a plurality of MOS transistors, each MOS transistor being arranged between a respective global word line, and a node connected to at least one respective local word line.

10. A memory according to claim 9 wherein each node is connected to two local word lines through a pair of local decoding switches which have control terminals connected to local decoding lines, the cells arranged on a same cell row being connected to local decoding switches controlled by a single selection signal.

11. A memory according to claim 10 wherein said local decoding switches are PMOS transistors.

12. A method for reading a nonvolatile multilevel memory storing words formed from a plurality of subwords, and including a plurality of cells, each of said cell having a respective threshold value coding a respective subword, said cells being arranged on cell rows and columns and grouped into sectors; the method comprising:

addressing selected cells through cell selection means;

simultaneously supplying a ramp voltage to a biasing terminal of each of said selected cells;

checking said threshold values of said selected cells and generating threshold attainment signals, when said ramp voltage reaches said threshold values of said selected cells;

separating individually said biasing terminals of said selected cells from said cell selection means, when said threshold attainment signals are generated, thereby individually maintaining said biasing terminals of said selected cells at a voltage substantially equal to said threshold value of the respective cell.

13. A method according to claim 12 wherein said sector is divided into a plurality of blocks, each block being relative to a different subword of each word, and said addressing step comprises selectively addressing a cell in each block of a sector.

14. A method according to claim 13 wherein each said sector is divided into a number of blocks in each sector, the number of blocks in each sector being equal to the number of subwords in a word.

15. A method according to claim 12, further comprising connecting said selected cells to a respective output line.

16. A nonvolatile multi-level memory for storing words formed from a plurality of subwords, comprising:

a plurality of cells, each cell having a control terminal, a conduction terminal, and a respective threshold value coding a respective subword, the cells being disposed on cell rows and columns;

global word lines extending parallel to the cell rows, each global word line being connected to the control terminals of cells arranged on a same cell row;

biasing lines extending parallel to the cell columns, each biasing line being connected to the conduction terminals of cells arranged on a same cell column;

a biasing circuit coupled to a selected one of the biasing lines to provide a bias to a selected column of cells through the selected biasing line; and output lines extending parallel to and separate from the biasing lines, a selected one of the output lines being coupled to a selected cell in the selected column of cells in a manner that outputs a value that indicates the threshold value of the selected cell.

17. The memory of claim 16, further comprising a plurality of selection transistors each having a control terminal and first and second conduction terminals, a selected one of the selection transistors having its control terminal connected to the global wordline that is connected to the control terminal of the selected cell, its first conduction terminal connected to the selected output line, and its second conduction terminal connected to the control terminal of the selected cell.

18. The memory of claim 16 wherein each row is divided into a plurality of blocks of cells, the memory further comprising a plurality of block switches each connecting a respective one of the global wordlines to the control terminals of the cells in a respective one of the blocks of cells.

19. The memory of claim 18 wherein each block switch is coupled by a plurality of local wordlines to the control terminals of cells in a respective subrow of a plurality of subrows of each row of cells.

20. The memory of claim 18, further comprising a sensing circuit coupled to the selected biasing biasing line and to a control terminal of a selected block switch that is coupled to the selected cell, the sensing circuit being structured to sense the threshold voltage of the selected cell and open the selected block switch when a ramp voltage applied to the control terminal of the selected cell equals the threshold voltage of the selected cell.

* * * * *

UNITED STATES PATENT AND TRADEMARK OFFICE
CERTIFICATE OF CORRECTION

PATENT NO.   : 6,456,527 B1
DATED        : September 24, 2002
INVENTOR(S)  : Giovanni Campardo et al.

It is certified that error appears in the above-identified patent and that said Letters Patent is hereby corrected as shown below:

<u>Title page,</u>
Item [30], the Foreign Application Priority Data, should read as:
-- Feb. 10, 1999    (EP) ............ 998300071.9 --.

Signed and Sealed this

Twenty-fourth Day of December, 2002

JAMES E. ROGAN
*Director of the United States Patent and Trademark Office*